United States Patent
Chen et al.

(10) Patent No.: US 8,426,245 B2
(45) Date of Patent: Apr. 23, 2013

(54) PACKAGING METHOD INVOLVING REARRANGEMENT OF DICE

(75) Inventors: Yu-Ren Chen, Hsinchu (TW); Geng-Shin Shen, Hsinchu (TW); Tz-Cheng Chiu, Hsinchu (TW)

(73) Assignees: ChipMos Technologies Inc, Hsinchu (TW); ChipMos Technologies (Bermuda) Ltd, Hamilton (BM)

( * ) Notice: Subject to any disclaimer, the term of this patent is extended or adjusted under 35 U.S.C. 154(b) by 104 days.

(21) Appl. No.: 13/082,160

(22) Filed: Apr. 7, 2011

(65) Prior Publication Data

US 2011/0183467 A1    Jul. 28, 2011

(51) Int. Cl.
    *H01L 21/56*    (2006.01)

(52) U.S. Cl.
    USPC .................................. 438/108; 257/E21.502

(58) Field of Classification Search .................. 438/108; 257/E21.502
    See application file for complete search history.

(56) References Cited

U.S. PATENT DOCUMENTS

| | | |
|---|---|---|
| 5,323,051 A | 6/1994 | Adams et al. |
| 6,830,958 B2 | 12/2004 | Makimoto |
| 6,881,611 B1 | 4/2005 | Fukasawa et al. |
| 6,897,096 B2 | 5/2005 | Cobbley et al. |
| 6,919,232 B2 | 7/2005 | Hedler et al. |
| 7,196,408 B2 | 3/2007 | Yang et al. |
| 2007/0212813 A1* | 9/2007 | Fay et al. ....................... 438/106 |
| 2008/0315385 A1* | 12/2008 | Gerber et al. ................. 257/686 |
| 2009/0065927 A1* | 3/2009 | Meyer ........................... 257/693 |

\* cited by examiner

*Primary Examiner* — Alexander Ghyka
*Assistant Examiner* — Stanetta Isaac
(74) *Attorney, Agent, or Firm* — Ming Chow; Sinorica, LLC (57) ABSTRACT

A packaging method is disclosed that comprises attaching a plurality of dice, each having a plurality of bonding pads disposed on an active surface, to an adhesive layer on a substrate. A polymer material is formed over at least a portion of both the substrate and the plurality of dice and a molding apparatus is used on the substrate to force the polymer material to substantially fill around the plurality of dice. The molding apparatus is removed to expose a surface of the polymer material and a plurality of cutting streets is formed on an exposed surface of the polymer material. The substrate is removed to expose the active surface of the plurality of dice.

14 Claims, 8 Drawing Sheets

PACKAGING METHOD INVOLVING REARRANGEMENT OF DICE

CROSS-REFERENCES TO RELATED APPLICATIONS

This application is related to U.S. patent application Ser. No. 12/173,936. And This application claims priority to Taiwan Patent Application No. 096130411, filed Aug. 17, 2007, the contents of which are hereby incorporated by reference in their entirety.

TECHNICAL FIELD

The present invention relates generally to the field of semiconductor processing. More particularly, the present invention relates to a packaging method for semiconductor integrated circuit devices.

BACKGROUND

Miniaturizing semiconductor dice has been an increasing trend for various functions. The miniaturized semiconductor dice is increasingly provided with more and more input/output (I/O) pads within a smaller region, so the density of metal pins are increased. Thus, the package technology of lead frames has been replaced by the technology of, for example, ball grid arrays (BGAs).

Advantages of BGAs include a compact form, increased density, and an arrangement allowing solder connections that are less subject to damage and distortion. With a variety of integrated circuit-based products in fashion, such as cell phones, personal data assistants, and MP3 players, the products are typically equipped with at least one systemic chip within a smaller volume.

A wafer level package (WLP) has been developed to package a wafer prior to sawing (i.e., dicing). For example, U.S. Pat. No. 5,323,051 discloses one type of wafer level package. However, for WLP, the increasing numbers of bonding pads, coupled with commensurate reduced pitches, which would result in signal coupling and noise. In addition, the reliability of the package may be reduced because of the reduced pitches. Thus, WLP may not satisfy the needs of smaller dice fabricated with smaller design rules.

In an attempt to resolve the issue, U.S. Pat. No. 7,196,408 discloses a method relating to the semiconductor packaging process. A plurality of good dice, after testing and sawing, is rearranged on another substrate for a sequential packaging process. The plurality of rearranged dices has wider pitches for suitable distribution of bonding pads thereon, such as using a fan-out technology. Such a method attempts to resolve the issues of signal coupling and noise caused by small pitches.

However, for the semiconductor chip with smaller and thinner packaging structures, prior to the wafer sawing, the wafer may be processed by a thinning process, such as the wafer is to be thinned in the thickness of 2 to 20 mils (i.e., 50.mu.m to 500.mu.m) by backside lapping. Then the wafer is sawn thus becoming individual dice. The thinned dices are rearranged on another substrate. Then, a molding process is applied on the thinned dice to form a molding structure. Because both the dice and the molding structure are greatly thinned, the stress from the molding structure itself causes warpage after the substrate is separated from the molding structure. The warpage of the molding structure may make a subsequent sawing process difficult. Accordingly, what is needed is a packaging method for die rearrangement that efficiently resolves the issue of warpage in a molding package.

SUMMARY

In an exemplary embodiment, a packaging method is disclosed. The packaging method comprises a plurality of dice is provided. Each the plurality of dices with an active surface and has a plurality of bonding pads disposed thereon. Each the plurality of dices is attached to an adhesive layer on a substrate. A polymer material is formed over at least a portion of both the substrate and the plurality of dices and a molding apparatus is used on the substrate to force the polymer material to substantially fill around the plurality of dices. The molding apparatus is removed to expose a surface of the polymer material and a plurality of cutting streets is formed on an exposed surface of the polymer material. The substrate is removed to expose the active surface of each the plurality of dices.

In another exemplary embodiment, a packaging method is disclosed. The packaging method comprises a plurality of dice which is provided. Each the plurality of dices has an active surface and a plurality of bonding pads disposed thereon. Each the plurality of dices is attached to an adhesive layer on a substrate. A molding apparatus is used to form a space on the substrate. A polymer material is injected into the space to substantially fill around the plurality of dices. The molding apparatus is removed to expose a surface of the polymer material. A plurality of cutting streets is formed on an exposed surface of the polymer material. The substrate is removed to expose the plurality of bonding pads on the active surface of each the plurality of dices to complete a package structure.

In another exemplary embodiment, a packaging method is disclosed. The packaging method comprises a plurality of dices which is provided. Each the plurality of dice has an active surface and a plurality of bonding pads disposed thereon. Each the plurality of dices is attached to an adhesive layer on a substrate. The adhesive layer has a plurality of ribs disposed thereon. A polymer material is formed over at least portions of both the substrate and the plurality of dice and a molding apparatus is used on the substrate to force the polymer material to substantially fill around the plurality of dice. The molding apparatus is removed to expose a surface of the polymer material and the substrate is then removed to expose the active surface of the plurality of dices and a plurality of slots on the polymer material.

In another exemplary embodiment, a packaging method is disclosed. The packaging method comprises a plurality of dices is provided. Each the plurality of dices has a plurality of bonding pads disposed on an active surface to an adhesive layer on a substrate having a plurality of ribs disposed thereon, using a molding apparatus on the substrate to form a space. A polymer material is injected into the space to fill substantially around the plurality of dices. The molding apparatus is removed to expose a surface of the polymer material, and the substrate is then removed to expose the active surface of the plurality of dices and a plurality of slots on the polymer material.

In another exemplary embodiment, a packaging method is disclosed. The packaging method comprises a plurality of dices which is provided. Each the plurality of dices has an active surface and a plurality of bonding pads disposed thereon. Each the plurality of dices is attached to an adhesive layer on a substrate. A polymer material is formed over at least a portion of both the substrate and the plurality of dices.

A molding apparatus is used on the substrate to force the polymer material to substantially fill around the plurality of dices where the molding apparatus has a first plurality of ribs formed thereon. The molding apparatus is removed to expose a surface of the polymer material and a plurality of slots formed therein, and the substrate is removed to expose the active surface of the plurality of dices.

In another exemplary embodiment, a packaging method is disclosed. The packaging method comprises a plurality of dices which is provided. Each the plurality of dices has an active surface and a plurality of bonding pads disposed thereon. Each the plurality of dices is attached to an adhesive layer on a substrate. A molding apparatus having a first plurality of ribs that is used on the substrate to form a space. A polymer material is injected into the space to substantially fill around the plurality of dices. The substrate is removed to expose the active surface of each the plurality of dices and a plurality of slots on the polymer material, and the substrate is removed to expose the active surface of the plurality of dices.

In another exemplary embodiment, a packaging structure is disclosed. The packaging structure is formed by a packaging method of dice rearrangement, wherein the packaging method comprises a plurality of dice which is provided. Each the plurality of dices has an active surface and a plurality of bonding pads disposed thereon. Each the plurality of dices is attached to an adhesive layer on a substrate. A molding apparatus is used on the substrate to form a space. The molding apparatus has a plurality of ribs thereon. A polymer material is injected into the space to substantially fill around the plurality of dices. The substrate is removed to expose the active surface of each the plurality of dices and a plurality of slots formed on the polymer material. The package structure is characterized by exposed portions of the polymer material which having circular-arc blunt angles of exposed portions of the plurality of dices.

BRIEF DESCRIPTION OF THE DRAWINGS

The appended drawings merely illustrate exemplary embodiments of the present invention and must not be considered as limiting its scope.

DETAILED DESCRIPTION

In various exemplary embodiments described herein, a packaging method involving rearrangement of sawn dice is disclosed. The packaging method eliminates stress in a packaged die thus the distortion can be minimized or eliminated after the substrate is removed. Thus, the yield and reliability of the packaged dice are enhanced.

In a specific exemplary embodiment, the dice derived from a 12-inch (300 mm) wafer are rearranged on the substrate of an 8-inch (200 mm) wafer. Packaging equipment for the 8-inch wafer (200 mm) may thus be utilized, and the packaging cost can be reduced. In other embodiments, all of the packaged dice are known good ones thus reducing packaging and manufacturing costs.

In other embodiments, a packaging method for dice rearrangement is disclosed which re-disposes dice on another substrate for packaging. The following illustrations and specification describe details of the process or steps for understanding the present invention.

In many modern semiconductor packaging processes, a wafer or other substrate which has been fabricated by a front end process subsequently undergoes a thinning process reducing the thickness of the wafer down to about 2 to 20 mil (50 μm to 500 μm). A sawing process is then performed on the wafer to form a plurality of dice 110 as noted in FIG. 1. The plurality of dice 110 is transferred from the wafer (e.g., a 12-inch (300 mm) wafer) on the right with a pick and place handler to a separate substrate 100 on the left.

Figure 1:
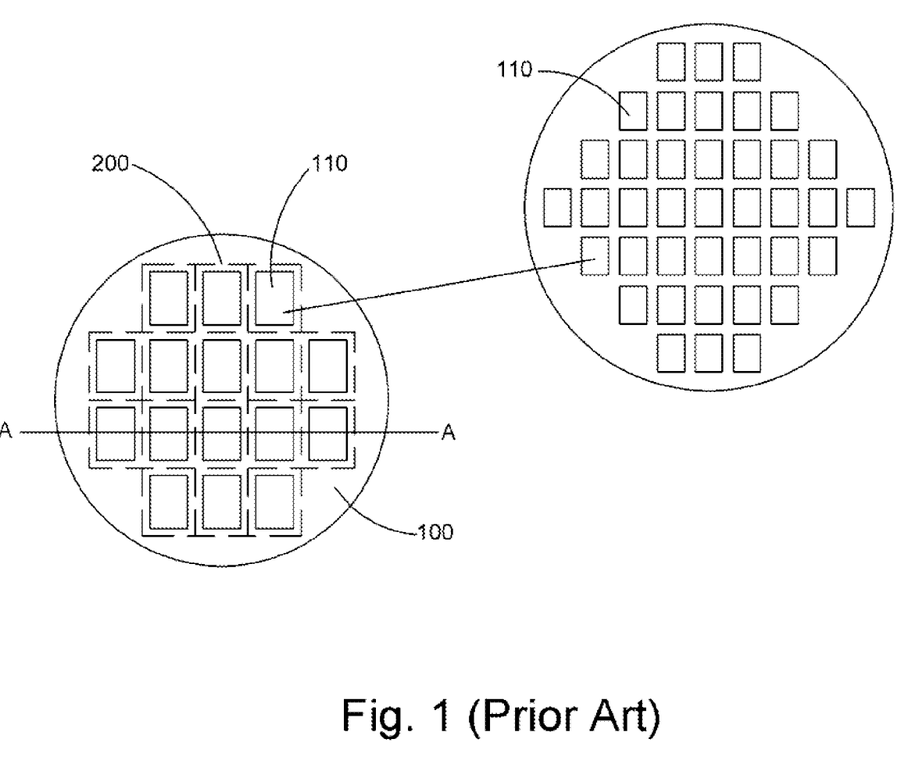
FIG. 1 is a plan view of dice located on a substrate prior to sawing and rearranged on another substrate after sawing.

As indicated in FIG. 1, the interval between each the plurality of dice 110 on the substrate 100 is larger than on the original substrate on the right since only known-good dice are transferred. Thus, there are wider pitches among the plurality of dices 110 on the substrate 100 than prior to sawing. Thus, the now-rearranged plurality of dices 110 each has a wider pitch for a subsequent deposition of bonding pads (not shown). Moreover, the plurality of dices is sawn from the 12-inch (300 mm) wafer may be rearranged on, for example, an 8-inch (200 mm) wafer and implemented by conventional package equipment for 8-inch (200 mm) wafers without setting new equipment for 12-inch (300 mm) wafers.

It is noted that various embodiments of the present invention are not limited to 8-inch (200 mm) wafers. Any substrate which may support dice and be in any shape, such as glass, quartz, ceramic, PCB, or metal foil, may be utilized for the substrate 100 of FIG. 1.

Figure 2A:
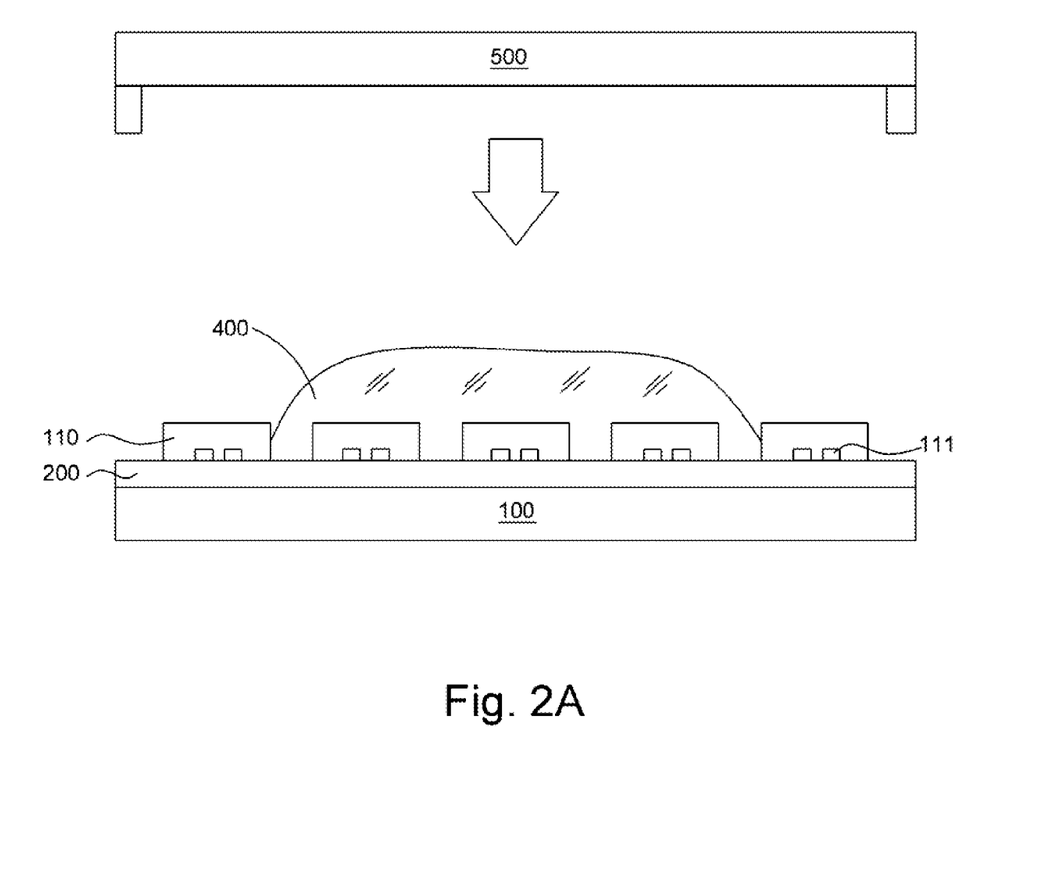
FIGS. 2A, 2B, and 2C are cross-sectional diagrams illustrating an exemplary embodiment in accord with the present invention.

With reference to FIG. 2A, a cross-sectional diagram corresponding to section line A-A of FIG. 1 includes an adhesive layer 200 deposited on the substrate 100. The adhesive layer 200 may be, for example, an elastic material such as silicone rubber, silicone resin, elastic polyurethane, porous polyurethane, acrylic rubber, or a die-sawing gel.

The plurality of dices 110 is transferred with a pick and place device to the adhesive layer 200 on the substrate 100. In a specific exemplary embodiment, the plurality of dices 110 is flip-chip devices thus a plurality of bonding pads 111 of an active surface is attached to the adhesive layer 200 on the substrate 100. In another exemplary embodiment, non flip-chip devices may simply be inverted prior to attachment to the adhesive layer 200.

A polymer material 400 is formed over at least a portion of both the substrate 100 and the plurality of dices 110. A molding apparatus 500 is capped over the polymer material 400 thus effectively planarizing and forcing the polymer material 400 to fill around and cover the plurality of dices 110. The polymer material 400 may be, for example, silicone, epoxy, acrylic, or benzocyclobutene-based (BCB) material.

The now-planarized polymer material 400 may be cured by, for example, a baking process. Once cured, the polymer material 400 is removed from the molding apparatus 500 by a demolding procedure, known independently in the art, to expose the planar surface of the polymer material 400.

Figure 2B:
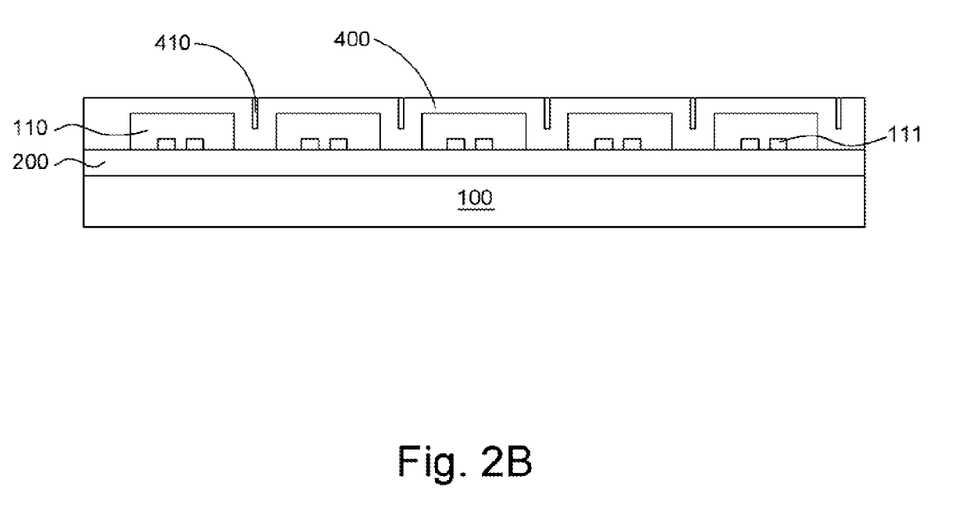

Referring now to FIG. 2B, a plurality of cutting streets 410 is made out into the surface of the polymer material 400 by cutting or sawing. In a specific exemplary embodiment, each of the plurality of cutting streets 410 has a depth about 0.5 to 1 mil (12.7 μm to 25.4 μm) and a width of about 0.5 to 1 mil (12.7 μm to 25.4 μm). In a specific exemplary embodiment, the plurality of cutting streets 410 may be crossed orthogonally with one another for the reference of sawing a wafer.

The polymer material 400 is then separated from the adhesive layer 200 by, for example, the polymer material 400 and the substrate 100 is dipped into a tank containing de-ionized water therein to form a package structure. A resulting package structure then may include a covered one of the plurality of dices 110 and exposes the plurality of bonding pads 111 of the active surface.

Because of the existence of the plurality of cutting streets 410, any stress on the package structure is eliminated after separation of the polymer material 400 and the substrate 100. Accordingly, the warpage problem of the prior art is resolved.

Figure 2C:
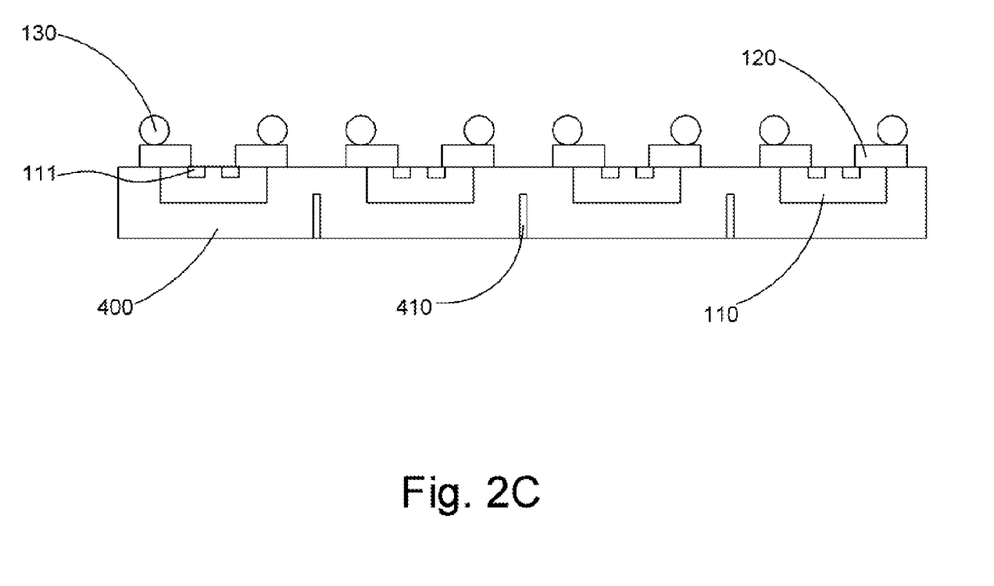

With reference now to FIG. 2C, a plurality of elongated metal lines 120 is formed on and electrically coupled to one end to select ones of the plurality of bonding pads 111 of each of the plurality of dices 110. A plurality of conductive elements 130, such as, for example, solder balls, is formed on the other ends of the plurality of elongated metal lines 120. Individual ones of the plurality of dices 110 are sawn to complete the packaging process. A skilled artisan will note that each one of the plurality of dices 110 in this embodiment has covered surfaces and only the active surfaces are exposed through the plurality of bonding pads 111.

In various embodiments described above, formation of a planarized version of the polymer material 400 may be implemented by a molding process. The molding apparatus 500 is capped on the substrate 100 forming a space from the plurality of dices 110 into which the polymer material 400 may be injected. The polymer material may be an epoxy molding compound (EMC). The molding apparatus 500 may further force the polymer material 400 to fill around and cover each one of the plurality of dices 110.

Figure 3A:
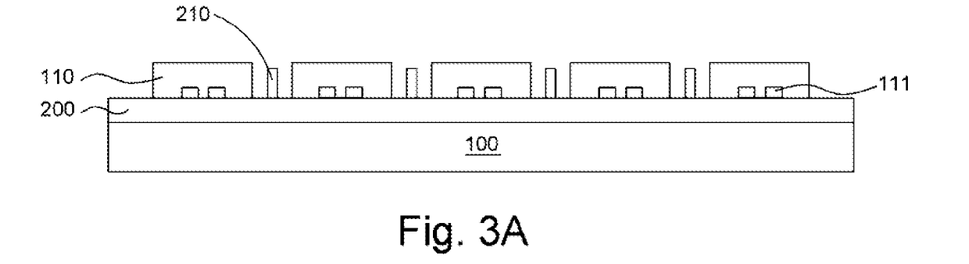
FIGS. 3A, 3B, and 3C are cross-sectional diagrams illustrating another exemplary embodiment in accord with the present invention.

Referring now to FIG. 3A, another embodiment of the present invention includes the adhesive layer 200 disposed on the substrate 100 with a plurality of ribs 210 formed on the adhesive layer 200. In a specific exemplary embodiment, a portion of the plurality of ribs 210 is crossed orthogonally with respect to one another. As noted above, the adhesive layer 200 may be formed from, for example, silicone rubber, silicone resin, elastic polyurethane, porous polyurethane, acrylic rubber, or a die-sawing gel. The plurality of ribs 210 may be formed from, for example, silicone rubber, silicone resin, elastic polyurethane, porous polyurethane, acrylic rubber, polyimide, or a die-sawing gel.

Each of the plurality of dices 110 is transferred from a pick and place device to both the adhesive layer 200 on the substrate 100 and among the plurality of ribs 210. In a specific exemplary embodiment, the plurality of dices 110 are flip-chip devices thus enabling a plurality of bonding pads 111 of an active surface to attach to the adhesive layer 200 on the substrate 100. In another exemplary embodiment, non flip-chip devices may simply be inverted prior to attachment to the adhesive layer 200.

A polymer material 400 is formed over at least a portion of both the substrate 100 and the plurality of dices 110. A molding apparatus 500 (FIG. 2A) is capped over the polymer material 400 thus effectively planarizing and forcing the polymer material 400 to fill around and cover the plurality of dices 110. The polymer material 400 may be, for example, silicone, epoxy, acrylic, or benzocyclobutene-based (BCB) material.

The polymer material 400 may alternatively be formed by a molding process. The molding apparatus 500 (FIG. 2A) is capped on the substrate 100 forming a space from the plurality of dices 110 into which the polymer material 400 may be injected. The polymer material may be an epoxy molding compound (EMC). The molding apparatus 500 may further force the polymer material 400 to fill around and cover each one of the plurality of dices 110.

Figure 3B:
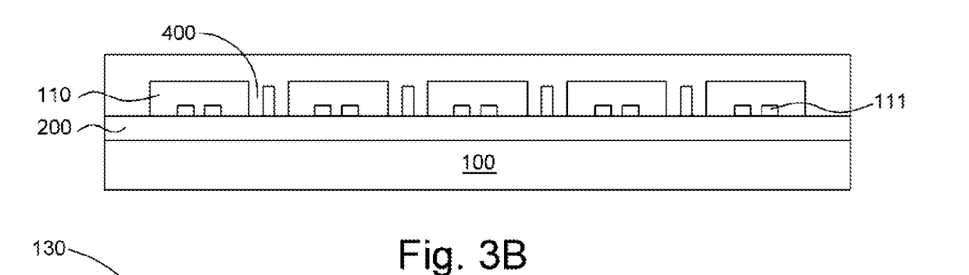

The now-planarized polymer material 400 may be cured by, for example, a baking process. Once cured, the polymer material 400 is removed from the molding apparatus 500 by a demolding procedure, known independently in the art, to expose the planar surface of the polymer material 400 as indicated in FIG. 3B.

Figure 3C:
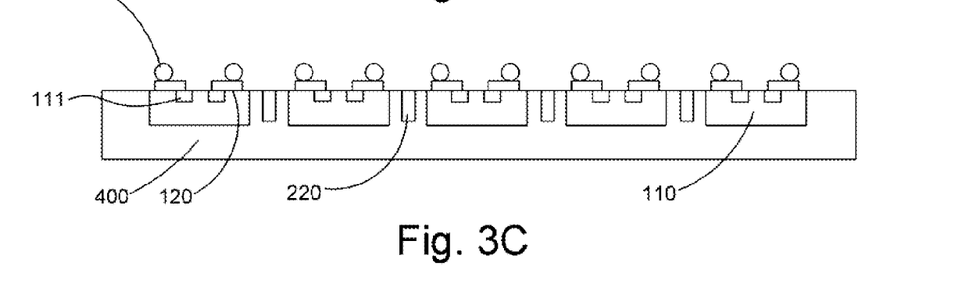

The polymer material 400 is then separated from the adhesive layer 200 by, for example, the polymer material 400 and the substrate 100 is dipped into a tank containing de-ionized water to form a package structure. A resulting package structure then may include a covered one of the plurality of dices 110 and the plurality of bonding pads 111 of the active surface and a plurality of slots 220 formed by the plurality of ribs 210 are to be exposed, as indicated in FIG. 3C. Because of the existence of the plurality of slots 220, stress on the package structure is eliminated after the separation of the polymer material 400 and the substrate 100.

With reference now to FIG. 3C, a plurality of elongated metal lines 120 is formed on and electrically coupled to one end to select ones of the plurality of bonding pads 111 of each of the plurality of dices 110. A plurality of conductive elements 130, such as, for example, solder balls, is formed on the other ends of the plurality of elongated metal lines 120. Individual ones of the plurality of dices 110 is sawn to complete the packaging process. A skilled artisan will note that each the plurality of dices 110 in this embodiment has covered surfaces and only the active surfaces are exposed through the plurality of bonding pads 111.

Figure 4A:
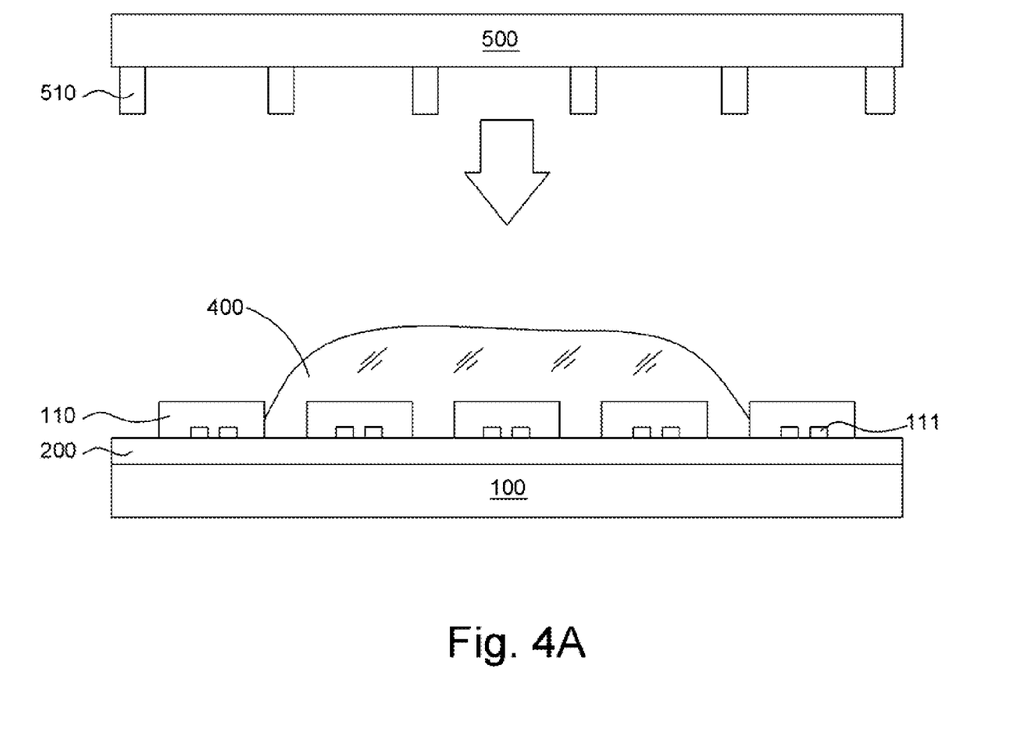
FIGS. 4A, 4B, and 4C are cross-sectional diagrams illustrating another exemplary embodiment in accord with the present invention.

With reference now to FIG. 4A, another exemplary embodiment of the present invention includes the adhesive layer 200 that is disposed on the substrate 100. As noted above, the adhesive layer 200 may be silicone rubber, silicone resin, elastic polyurethane, porous polyurethane, acrylic rubber, or a die-sawing gel.

Each of the plurality of dices 110 is transferred from a pick and place device to both the adhesive layer 200 on the substrate 100 and among a plurality of ribs 510. In a specific exemplary embodiment, the plurality of dices 110 is flip-chip devices thus a plurality of bonding pads 111 of an active surface is attached to the adhesive layer 200 on the substrate 100. In another exemplary embodiment, non flip-chip devices may simply be inverted prior to attachment to the adhesive layer 200.

A polymer material 400 is formed over at least a portion of both the substrate 100 and the plurality of dices 110. A molding apparatus 500 is capped over the polymer material 400 thus effectively planarizing and forcing the polymer material 400 to fill around and cover the plurality of dices 110. The polymer material 400 may be, for example, silicone, epoxy, acrylic, or benzocyclobutene-based (BCB) material.

Figure 4B:
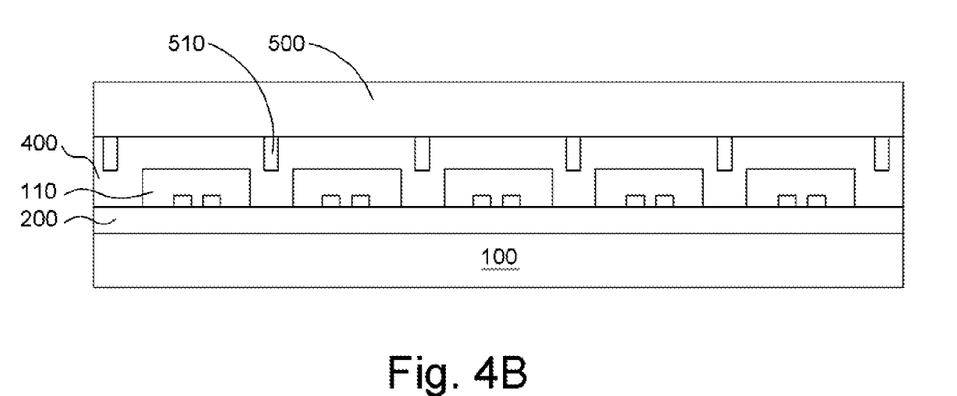

The polymer material 400 may alternatively be formed by a molding process as indicated in FIG. 4B. The molding apparatus 500 with the plurality of ribs 510 is capped on the substrate 100 forming a space from the plurality of dices 110 into which the polymer material 400 may be injected. The polymer material may be an epoxy molding compound (EMC). The molding apparatus 500 may further force the polymer material 400 to fill around and cover each the plurality of dices 110.

The now-planarized polymer material 400 may be cured by, for example, a baking process. Once cured, the polymer material 400 is removed from the molding apparatus 500 with the plurality of ribs 510 by a demolding procedure, known independently in the art, to expose a plurality of slots 520 formed by the plurality of ribs 510 formed on the molding apparatus 500.

Figure 4C:
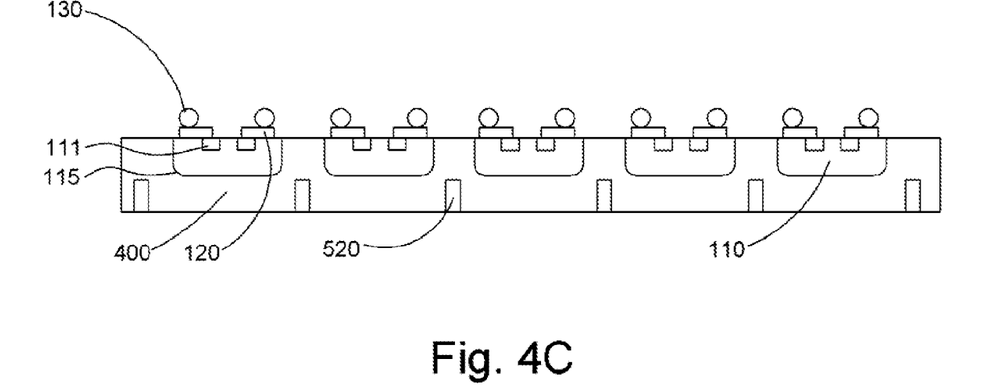

The polymer material 400 is then separated from the adhesive layer 200 by, for example, the polymer material 400 and the substrate 100 is dipped into a tank containing de-ionized water to form a package structure. A resulting package structure then may include a covered one of the plurality of dice 110 and the plurality of bonding pads 111 of the active surface and a plurality of slots 520 formed by the plurality of ribs 510 are to be exposed, as indicated in FIG. 4C. Because of the existence of the plurality of slots 520, stress on the package structure is eliminated after the separation of the polymer material 400 and the substrate 100.

With reference now to FIG. 4C, a plurality of elongated metal lines 120 is formed on and electrically coupled to one end to select ones of the plurality of bonding pads 111 of each of the plurality of dices 110. A plurality of conductive elements 130, such as, for example, solder balls, is formed on the other ends of the plurality of elongated metal lines 120. Individual ones of the plurality of dices 110 is sawn to complete the packaging process. A skilled artisan will note that each the plurality of dice 110 in this embodiment has covered surfaces and only the active surfaces are exposed through the plurality of bonding pads 111.

A sawing process is performed to individual dice, thus completing the packaging process. In the molding process of various embodiments of FIGS. 4A-4C, the molding apparatus 500 with the plurality of ribs 510 is used to cap the substrate 100. When the polymer material 400 is injected, the air chamber is formed around each enclosed corner of the plurality of ribs 510 to form a circular-arc blunt angle structure 115, as noted in FIG. 4C.

Figure 5A:
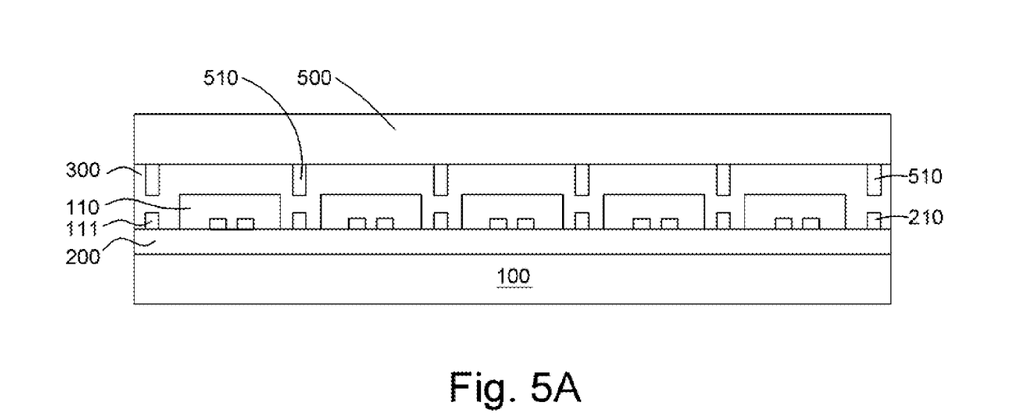
FIGS. 5A and 5B are cross-sectional diagrams illustrating another exemplary embodiment in accord with the present invention.
Figure 5B:
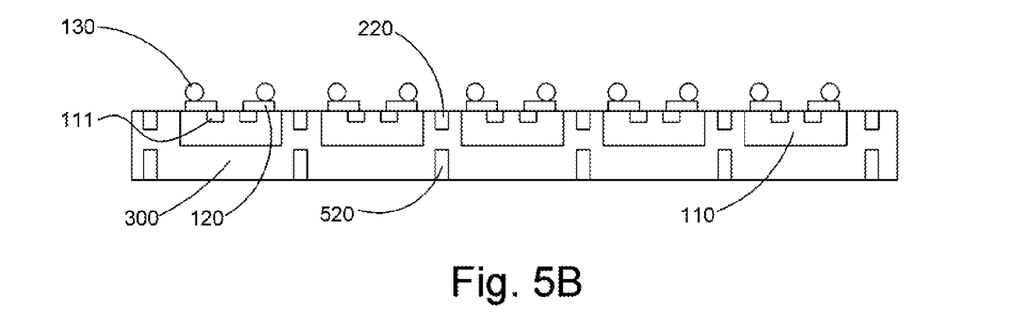

FIGS. 5A and 5B are another exemplary embodiment of a packaging method in accordance with the present invention and are a combination of various portions of embodiments described above with reference to FIGS. 3A and 4A. Using a combination of methods disclosed above, a plurality of upper 220 and lower 520 slots are formed on a top and bottom surface, respectively, of the polymer material 400. The plurality of upper 220 and lower 520 slots eliminates stress on the package structure, thus preventing any distortion or warpage.

As noted above with regard to similar steps in other exemplary embodiments, a plurality of elongated metal lines 120 is formed on and electrically coupled to one end to select ones of the plurality of bonding pads 111 of each the plurality of dices 110. A plurality of conductive elements 130, such as, for example, solder balls, is formed on the other ends of the plurality of elongated metal lines 120. Individual ones of the plurality of dices 110 is sawn to complete the packaging process. A skilled artisan will note that each the plurality of dices 110 in this embodiment has covered surfaces and only the active surfaces are exposed through the plurality of bonding pads 111.

The present invention is described above with reference to specific embodiments thereof. It will, however, be evident to a skilled artisan that various modifications and changes can be made thereto without departing from the broader spirit and scope of the present invention as set forth in the appended claims.

For example, particular embodiments describe a number of package arrangements. A skilled artisan will recognize that these package arrangements and materials may be varied and those shown herein are for exemplary purposes only in order to illustrate the novel nature of the packaging and resulting stress reduction or elimination concepts. Other materials, known independently in the art, may be utilized to form various features described herein.

Additionally, a skilled artisan will further recognize that the techniques described herein may be applied to any type of chip mounting system whether or not a thin chip is employed. The application to a thin chip in the semiconductor industry is purely used as an exemplar to aid one of skill in the art in describing various embodiments of the present invention.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A packaging method, comprising:
   providing a plurality of dices, wherein each of said dices has a plurality of bonding pads disposed on an active surface;
   attaching said plurality of dices on a substrate, wherein each said plurality of dices is flip-chip to be attached to an adhesive layer on said substrate;
   forming a polymer material on said substrate and a portion of said plurality of dices;
   capping a molding apparatus on said polymer material to enforce said polymer material to fill around said plurality of dices and cover each said plurality of dices, wherein a plurality of ribs is disposed on said molding apparatus;
   removing said molding apparatus to expose a surface of said polymer material and form a plurality of slots on said surface of said polymer material which is formed by said plurality of ribs;
   removing said substrate to expose said active surface of each said plurality of dices and to expose said active surface of each said plurality of bonding pads;
   forming a plurality of elongated metal lines, each said plurality of elongated metal lines having a first end electrically coupled to one of said plurality of bonding pads; and
   forming a plurality of conductive elements on a second end of each said plurality of elongated metal lines.

2. The packaging method according to claim 1, wherein said adhesive layer is an elastic material.

3. The packaging method according to claim 1, wherein a depth of said plurality of slots is from 0.5 to 1 mil.

4. A packaging method, comprising:
   providing a plurality of dices, wherein each said plurality of dices has a plurality of bonding pads disposed on an active surface;
   attaching said plurality of dices on a substrate, wherein each of said dices is flip-chip to be attached to an adhesive layer on said substrate;
   capping a molding apparatus on said polymer material to form a space, wherein a plurality of first ribs is disposed on said molding apparatus;
   injecting a polymer material into said space to fill around said plurality of dices and cover each said plurality of dices;
   removing said molding apparatus to expose a surface of said polymer material and form a plurality of slots on said surface of said polymer material which is formed by said plurality of ribs;
   removing said substrate to expose said active surface of each said plurality of dices and to expose said active surface of each said plurality of bonding pads;

forming a plurality of elongated metal lines, each said plurality of elongated metal lines having a first end electrically coupled to one of said plurality of bonding pads; and forming a plurality of conductive elements on a second end of each said plurality of elongated metal lines.

5. The packaging method according to claim 4, wherein said adhesive layer is an elastic material.

6. The packaging method according to claim 4, wherein a depth of said plurality of slots is from 0.5 to 1 mil.

7. A packaging method, comprising:
providing a plurality of dices, wherein each said plurality of dices has a plurality of bonding pads disposed on an active surface;
providing an adhesive layer attached to a substrate, and a plurality of first ribs is disposed on said adhesive layer;
attaching said plurality of dices on said adhesive layer, wherein each said plurality of dices is flip-chip to be attached to said adhesive layer on said substrate, and said plurality of dices is separated from each another with said plurality of first ribs;
forming a polymer material on said substrate and a portion of said plurality of dices;
capping a molding apparatus on said polymer material to enforce said polymer material to fill around said plurality of dices and cover each said plurality of dices, wherein a plurality of second ribs is disposed on said molding apparatus;
removing said molding apparatus to expose a surface of said polymer material and form a plurality of second slots on said surface of said polymer material which is formed by said plurality of second ribs;
removing said substrate to expose said active surface of each said plurality of dices and to expose said active surface of each said plurality of bonding pads, and to expose a plurality of first slots on said polymer material which is formed by said plurality of first ribs; and
forming a plurality of electrically connecting devices on said plurality of bonding pads of each said plurality of dices.

8. The packaging method according to claim 7, wherein said adhesive layer is an elastic material.

9. The packaging method according to claim 7, wherein said plurality of first ribs is formed by an elastic material.

10. The packaging method according to claim 7, wherein a depth of said first plurality of slots and said second plurality of slots is from 0.5 to 1 mil.

11. A packaging method, comprising:
providing a plurality of dices, wherein each said plurality of dices has a plurality of bonding pads disposed on an active surface;
providing an adhesive layer attached to a substrate, and a plurality of first ribs is disposed on said adhesive layer;
attaching said plurality of dices on said adhesive layer, wherein each said plurality of dices is flip-chip to be attached to said adhesive layer on said substrate, and said plurality of dices is separated from each another with said plurality of first ribs;
capping a molding apparatus on said polymer material to form a space, wherein a plurality of second ribs is disposed on said molding apparatus;
injecting a polymer material into said space to fill around said plurality of dices and cover each said plurality of dices;
removing said molding apparatus to expose a surface of said polymer material and form a plurality of second slots on said surface of said polymer material which is formed by said plurality of second ribs;
removing said substrate to expose said active surface of each said plurality of dices and to expose said active surface of each said plurality of bonding pads, and to expose a plurality of first slots on said polymer material which is formed by said plurality of first ribs; and
forming a plurality of electrically connecting devices on said plurality of bonding pads of each said plurality of dices.

12. The packaging method according to claim 11, wherein said adhesive layer is an elastic material.

13. The packaging method according to claim 11, wherein said plurality of first ribs is formed by an elastic material.

14. The packaging method according to claim 11, wherein a depth of said first plurality of slots and said second plurality of slots is from 0.5 to 1 mil.

* * * * *